United States Patent
Choi et al.

(10) Patent No.: US 11,800,773 B2
(45) Date of Patent: Oct. 24, 2023

(54) ORGANIC LIGHT EMITTING DISPLAY DEVICE

(71) Applicant: LG Display Co., Ltd., Seoul (KR)

(72) Inventors: Wonjin Choi, Seoul (KR); Younghoon Kim, Goyang-si (KR); Jungmin Yoon, Goyang-si (KR); Seungcheol You, Seoul (KR)

(73) Assignee: LG Display Co., Ltd., Seoul (KR)

(*) Notice: Subject to any disclaimer, the term of this patent is extended or adjusted under 35 U.S.C. 154(b) by 286 days.

(21) Appl. No.: 17/384,231

(22) Filed: Jul. 23, 2021

(65) Prior Publication Data
US 2022/0069015 A1   Mar. 3, 2022

(30) Foreign Application Priority Data
Aug. 28, 2020 (KR) .................. 10-2020-0109695

(51) Int. Cl.
*H01L 51/52* (2006.01)
*H10K 59/38* (2023.01)
*H10K 50/84* (2023.01)
*H10K 59/123* (2023.01)
*H10K 59/35* (2023.01)

(52) U.S. Cl.
CPC ............. *H10K 59/38* (2023.02); *H10K 50/84* (2023.02); *H10K 59/123* (2023.02); *H10K 59/351* (2023.02); *H10K 59/352* (2023.02); *H10K 59/353* (2023.02)

(58) Field of Classification Search
CPC ...... H10K 59/38; H10K 50/84; H10K 59/351; H10K 59/352; H10K 59/353; H10K 2102/351; H10K 50/858; H01L 27/1248
See application file for complete search history.

(56) References Cited

FOREIGN PATENT DOCUMENTS

| CN | 10942804 A | * 3/2019 | .......... H10K 50/858 |
|---|---|---|---|
| KR | 10-2017-0052455 A | 5/2017 | |

OTHER PUBLICATIONS

English Machine Translation of Kim et al, CN 109428004 (Year: 2023).*

* cited by examiner

*Primary Examiner* — Donald L Raleigh
(74) *Attorney, Agent, or Firm* — Fenwick & West LLP

(57) ABSTRACT

An organic light emitting display device includes a substrate having a first sub-pixel, a second sub-pixel, a third sub-pixel and a fourth sub-pixel arranged in a quad type of a 2×2 matrix form, a first color filter disposed in the first sub-pixel, a second color filter disposed in the second sub-pixel, a third color filter disposed in the third sub-pixel, and a planarization layer covering the first to third color filters, wherein the planarization layer has a concave portion of a lens shape in the fourth sub-pixel, wherein the concave portion has a width greater than that of the fourth sub-pixel. Accordingly, the organic light emitting display device with improved light extraction efficiency of the fourth sub-pixel may be implemented.

20 Claims, 10 Drawing Sheets

ORGANIC LIGHT EMITTING DISPLAY DEVICE

CROSS-REFERENCE TO RELATED APPLICATION

This application claims a benefit under 35 U.S.C. § 119(a) of Korean Patent Application No. 10-2020-0109695 filed on Aug. 28, 2020, in the Korean Intellectual Property Office, the entirety of disclosure of which is incorporated herein by reference for all purposes.

BACKGROUND

Field

The present disclosure relates to an organic light emitting display device, and more specifically, to an organic light emitting display device capable of improving light extraction efficiency.

Description of Related Art

As the information society develops, the demand for display devices is increasing in various forms. In response to this demand, display devices such as liquid crystal display panels, plasma display panels, and organic light emitting display panels are being researched and commercialized.

An organic light emitting display device to which the organic light emitting display panel is applied is a self-luminous display device. Unlike a liquid crystal display device, the organic light emitting display device does not require a separate light source and thus is relatively light and thin. Further, the organic light emitting display device operates at a low voltage, and has excellent characteristics in color rendering, response speed, viewing angle, contrast ratio, etc., and has been widely used in recent years.

Light emitted from an organic light emitting layer of the organic light emitting display device passes through various components of the organic light emitting display device and exits the organic light emitting display device. In this connection, a portion of light is trapped inside the organic light emitting display device, so that light extraction efficiency of the organic light emitting display device may be lowered.

SUMMARY

The present disclosure is intended to solve the above-described problem, and thus a purpose thereof is to provide an organic light emitting display device capable of improving light extraction efficiency, in particular, light extraction efficiency of a white sub-pixel.

Further, a purpose of the present disclosure is to provide an organic light emitting display device capable of suppressing discontinuation of an anode or a short-circuit defect between the anode and a cathode within a contact hole of a planarization layer.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

According to one aspect of the present disclosure for achieving the above-described technical purposes, an organic light emitting display device includes a substrate having a first sub-pixel, a second sub-pixel, a third sub-pixel and a fourth sub-pixel arranged in a quad type of a 2×2 matrix form, a first color filter disposed in the first sub-pixel, a second color filter disposed in the second sub-pixel, a third color filter disposed in the third sub-pixel, and a planarization layer covering the first, second, and third color filters, wherein the planarization layer has a concave portion of a lens shape in the fourth sub-pixel, wherein the concave portion has a width greater than that of the fourth sub-pixel.

According to one aspect of the present disclosure for achieving the above technical purpose, an organic light emitting display device includes a substrate having a first sub-pixel, a second sub-pixel, a third sub-pixel, and a fourth sub-pixel sequentially arranged in a clockwise direction in a 2×2 matrix form, a first color filter disposed in the first sub-pixel, a second color filter disposed in the second sub-pixel, a third color filter disposed in the third sub-pixel, and a planarization layer covering the first, second, and third color filters, wherein the planarization layer has a concave portion of a lens shape in the fourth sub-pixel, wherein the concave portion has a width greater than that of the fourth sub-pixel, wherein each of a side face of the first color filter adjacent to the fourth sub-pixel and a side face of the third color filter adjacent to the fourth sub-pixel has a concave area.

According to the present disclosure, the planarization layer has the concave portion of a lens shape in the fourth sub-pixel, wherein the concave portion has a width greater than that of the fourth sub-pixel. Thus, the light extraction efficiency of the fourth sub-pixel white sub-pixel may be improved.

Further, according to the present disclosure, providing areas of the passivation layer having different thicknesses under the contact hole of the planarization layer may allow suppressing the discontinuation of the anode or the short-circuit defect between the anode and the cathode within the contact hole of the planarization layer.

Effects of the present disclosure are not limited to the above-mentioned effects, and other effects as not mentioned will be clearly understood by those skilled in the art from following descriptions.

DETAILED DESCRIPTIONS

Figure 1:
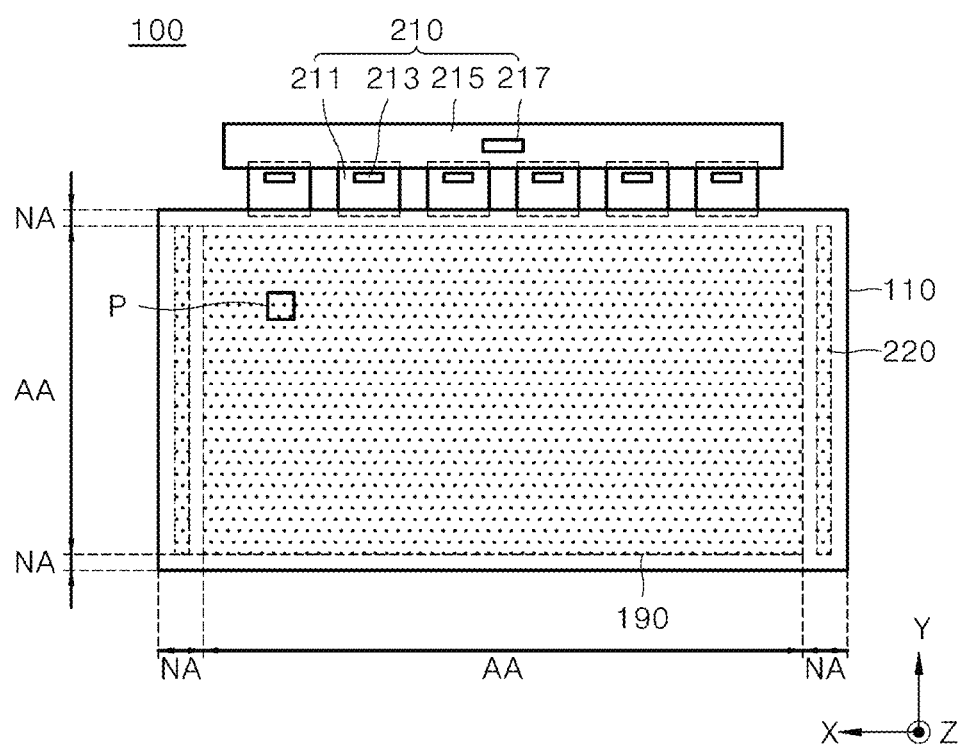
FIG. 1 is a plan view showing an organic light emitting display device according to one embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an organic light emitting display device according to various embodiments of the present disclosure will be described in detail.

FIG. 1 is a plan view showing an organic light emitting display device according to one embodiment of the present disclosure.

Referring to FIG. 1, an organic light emitting display device 100 includes a substrate 110, a pixel array layer 190, a display driver circuitry 210, and a scan driver circuitry 220.

The substrate 110 acts as a base substrate and may be embodied as a flexible substrate. For example, the substrate 110 may include a transparent polyimide material. The substrate 110 may be made of polyimide having excellent heat resistance that may withstand high temperatures, given that a high-temperature deposition process is performed in manufacturing the organic light emitting display device 100. The substrate 110 may be formed by curing a polyimide resin coated at a predetermined thickness on a top face of a sacrificial layer provided on a carrier glass substrate. According to an example, the substrate 110 may be a glass substrate.

The substrate 110 may include a display area AA and a non-display area NA. The display area AA may be an area in which an image is displayed and may be defined in an inner portion of the substrate 110. For example, a plurality of pixels P for displaying an image may be arranged in the display area AA. The non-display area NA may be an area in which an image is not displayed, and may be defined in an edge portion of the substrate 110 surrounding the display area AA. According to an example, the non-display area NA may include a pad area having at least one pad electrode.

The pixel array layer 190 includes a thin-film transistor layer and a light emitting element layer. The thin-film transistor layer may include a thin-film transistor, an interlayer insulating film, a passivation layer, and a planarization layer. The light emitting element layer may include a plurality of organic light emitting elements and a bank. The pixel array layer 190 may be disposed on the substrate 110, and may constitute the display panel.

The display driver circuitry 210 may be connected to the pad electrode provided in the non-display area NA of the substrate 110 to display an image corresponding to image data supplied from a display driving system on each pixel. According to an example, the display driver circuitry 210 may include a plurality of circuit films 211, a plurality of data driving integrated circuits 213, a printed circuit board 215, and a timing controller 217.

An input terminal provided on one side of each of the plurality of circuit films 211 may be attached to the printed circuit board 215 via a film attaching process. An output terminal provided on the opposite side of each of the plurality of circuit films 211 may be attached to the pad via a film attaching process. According to an example, each of the plurality of circuit films 211 may be implemented as a flexible circuit film and may be bent in order to reduce a bezel area of the organic light emitting display device 100. For example, each of the plurality of circuit film 211 may be embodied as a TCP (Tape Carrier Package), or a COF (Chip On Flexible Board, or Chip On Film).

The plurality of data driving integrated circuits 213 may be respectively mounted on the plurality of circuit films 211. Each of these plurality of data driving integrated circuits 213 may receive pixel data and a data control signal provided from the timing controller 217, and may convert the pixel data into an analog data signal for each pixel based on the data control signal and may supply the converted data signal to a corresponding data line.

The printed circuit board 215 may support the timing controller 217, and may transmit a signal and a power between components of the display driver circuitry 210. The printed circuit board 215 may supply a signal and a driving power supplied from the timing controller 217 to display an image on each pixel to the plurality of data driving integrated circuits 213 and the scan driver circuitry 220. To this end, a signal transmission line and various power lines may be provided on the printed circuit board 215. For example, the number of the printed circuit boards 215 may vary depending on the number of the circuit films 211.

The timing controller 217 may be mounted on the printed circuit board 215, and may receive the image data and a timing synchronization signal provided from the display driving system via a user connector provided on the printed circuit board 215. The timing controller 217 may align the image data according to a pixel arrangement structure based on the timing synchronization signal to generate the pixel data. The generated pixel data may be provided to a corresponding data driving integrated circuit 213. The timing controller 217 may generate a data control signal and a scan control signal based on the timing synchronization signal, and may control an operation timing of each of the plurality of data driving integrated circuit 213 based on the data control signal, and may control an operation timing of the scan driver circuitry 220 based on the scan control signal. In this connection, the scan control signal may be supplied to the corresponding scan driver circuitry 220 via the first and/or the last flexible circuit film among the plurality of circuit films 211 and the non-display area NA of the substrate 110.

The scan driver circuitry 220 may be provided in the non-display area NA of the substrate 110. The scan driver circuitry 220 may generate a scan signal according to the scan control signal provided from display driver circuitry 210, and may supply the generated scan signal to a scan line corresponding to a set order. According to an example, the scan driver circuitry 220 together with a thin-film transistor may be disposed in the non-display area NA of the substrate 110.

Figure 2:
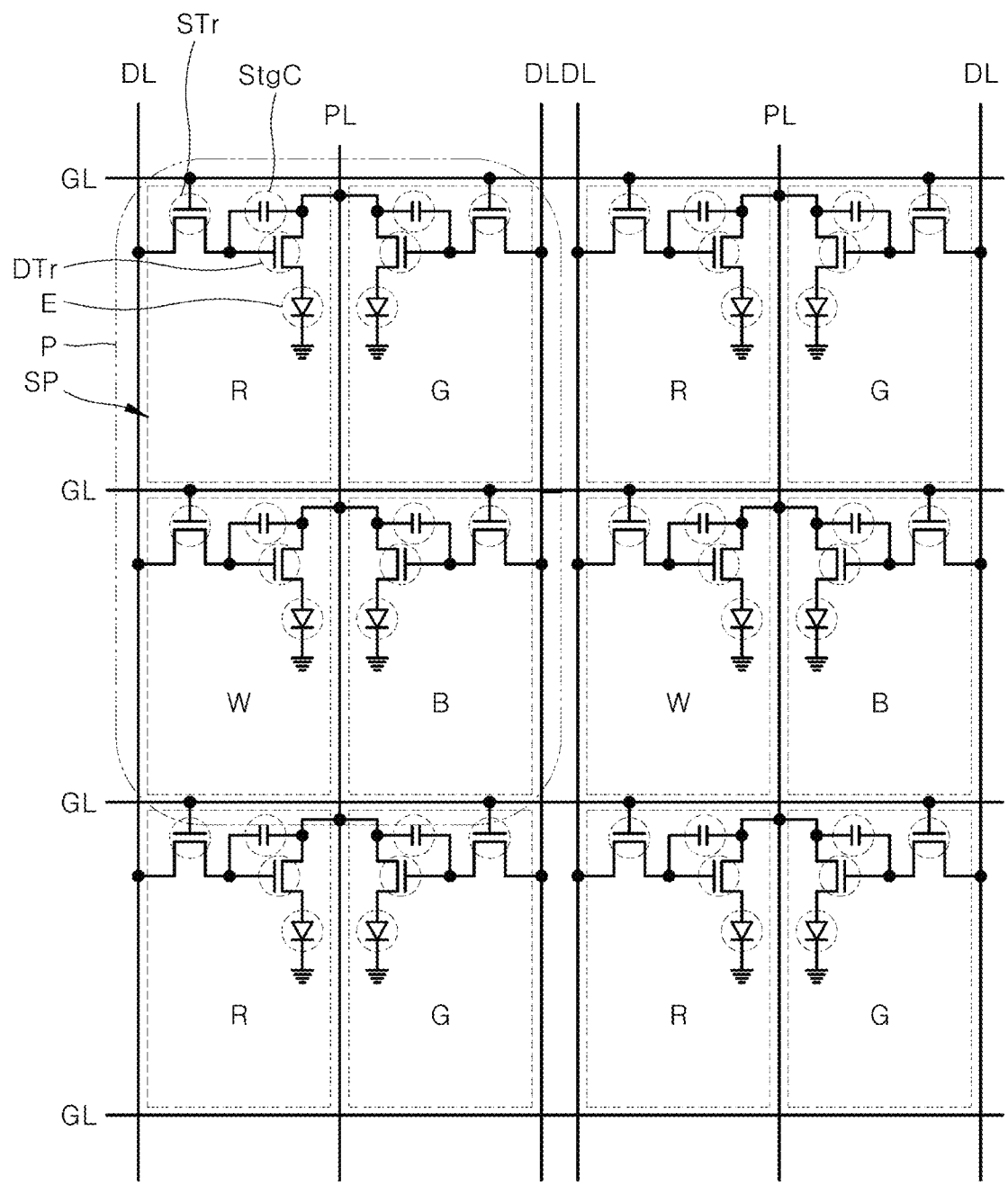
FIG. 2 is a circuit diagram showing a pixel P shown in FIG. 1.

FIG. 2 is a circuit diagram of an organic light emitting display device according to one embodiment of the present disclosure.

In one embodiment of the present disclosure, red R, green G, blue B, and white W sub-pixels SP may be arranged in a quad type of a 2×2 matrix form. For example, the R, G, B, W sub-pixels may be sequentially arranged in a clockwise direction. That is, the R sub-pixel and the B sub-pixel may be arranged diagonally to each other, while the G sub-pixel and the W sub-pixel may be arranged diagonally to each other. The arrangement sequence of the R, G, B, W sub-pixels may vary as necessary.

More specifically, as shown in FIG. 2, gate lines GL extend in a first direction, data lines DL extend in a second direction intersecting the first direction. Power lines PL to apply a power voltage are spaced apart from the data lines DL and extend in the second direction. Each sub-pixel SP may be defined by two gate lines GL extending in the first direction and the data line DL and the power line PL extending in the second direction. One pixel P contains 4 sub-pixels SP defined by three gate lines GL, two data lines DL and one power line PL intersecting the three gate lines GL.

In each sub-pixel SP, a switching thin-film transistor STr is formed in an area where the gate line GL and the data line DL intersect with each other and is connected to the gate line GL and the data line DL. The switching thin-film transistor STr is connected to the driving thin-film transistor DTr and a storage capacitor StgC, while the driving thin-film transistor DTr is connected to and disposed between the power line PL and an organic light emitting diode E. Driving thin-film transistors DTr of sub-pixels SP, for example, R and G sub-pixels, are adjacent to each other and in parallel with each other, and driving thin-film transistors DTr of sub-pixels SP, for example, W and B sub-pixels, are adjacent to each other and in parallel with each other and may be connected to a single power line PL at the same time.

Figure 3:
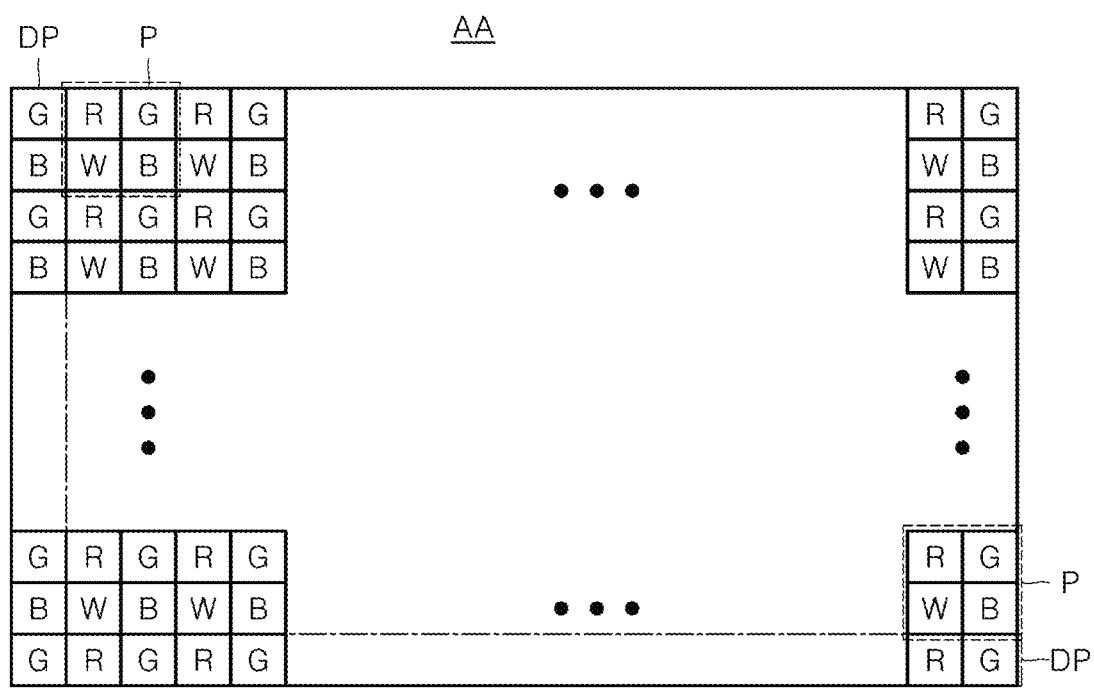
FIG. 3 is a plan view showing a display area AA shown in FIG. 1.

FIG. 3 is a plan view showing the display area AA shown in FIG. 1.

Referring to FIG. 3, a plurality of pixels P including R, G, B, and W sub-pixels may be disposed in an inner region of the display area AA of the substrate 110.

A plurality of dummy sub-pixels DP may be disposed along and in at least two edge areas among four edge areas of the display area AA of the substrate 110.

In one embodiment of the present disclosure, at least two edge areas among four edge areas of the display area AA of the substrate 110 in which the dummy sub-pixels DP are disposed may be determined based on an arrangement structure of the R, G, B, and W sub-pixels in one pixel P, in other words, based on a position where the W sub-pixel is disposed in one pixel P.

This is because, in one embodiment of the present disclosure, in order that the planarization layer covering the color filters has a concave portion of a lens shape in the W sub-pixel, the W sub-pixel should be surrounded with the remaining R, G, and B sub-pixels, as will be described again later.

In FIG. 3, one pixel P of the organic light emitting display device 100 has a quad type of a 2×2 matrix form in which the R, G, B, W sub-pixels are sequentially arranged in the clockwise direction. Thus, the dummy sub-pixels DP may be disposed along left and lower edge areas among the four edge areas of the display area AA of the substrate 110. Alternatively, when one pixel P of the organic light emitting display device 100 has a quad type of a 2×2 matrix form in which R, G, W, B sub-pixels are sequentially arranged in the clockwise direction, the dummy sub-pixels DP may be disposed along the right and lower edge areas among the four edge areas of the display area AA of the substrate 110.

Figure 4:
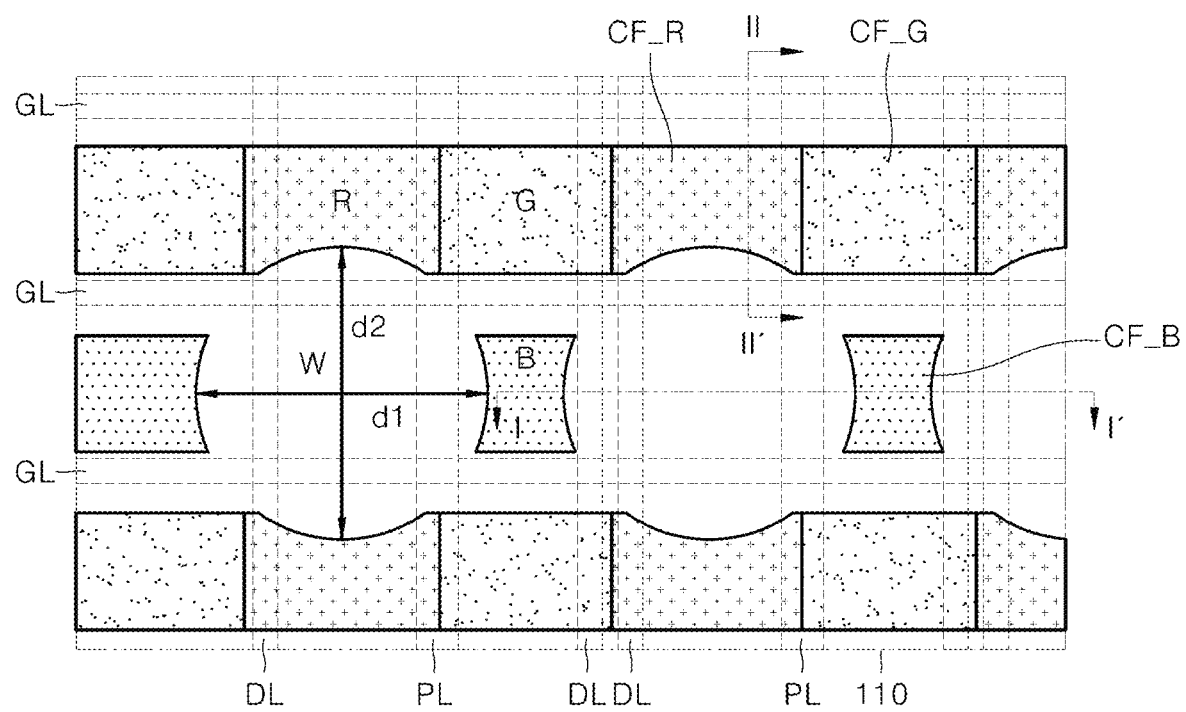
FIG. 4 is a schematic plan view of a pixel P of an organic light emitting display device according to one embodiment of the present disclosure.
Figure 5:
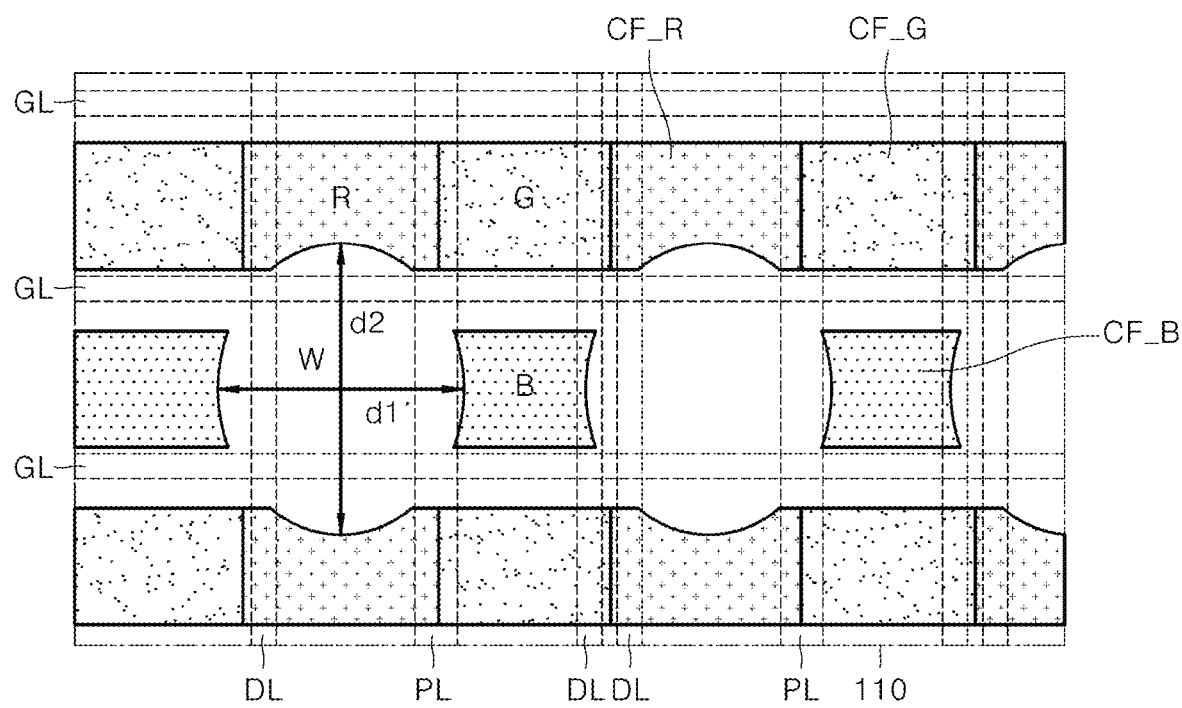
FIG. 5 is a schematic plan view of a pixel P of an organic light emitting display device according to another embodiment of the present disclosure.
Figure 6:
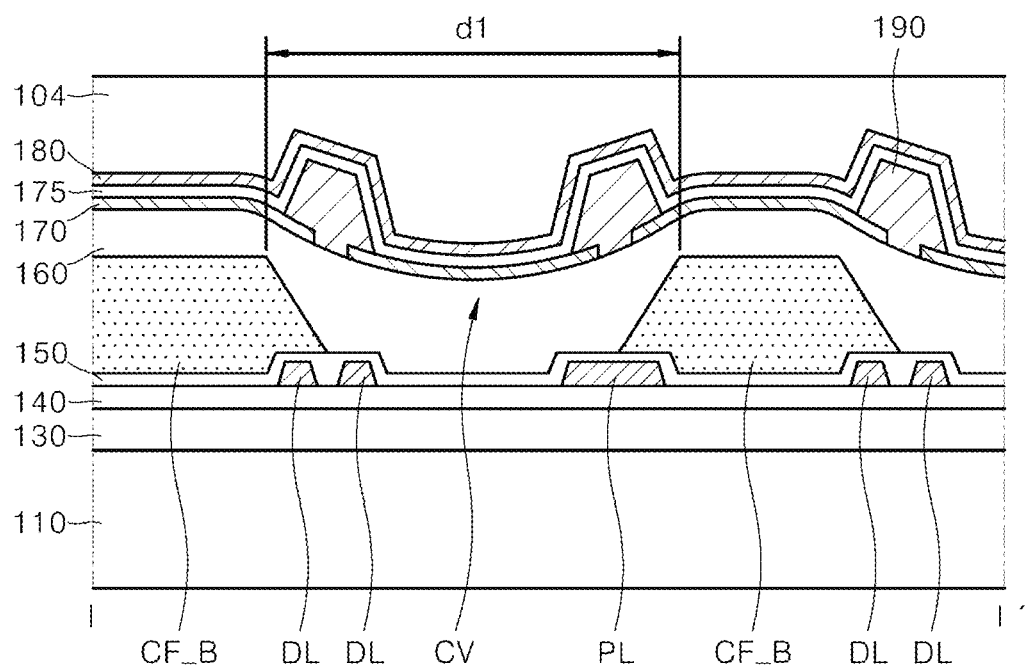
FIG. 6 is a cross-sectional view of an organic light emitting display device cut along a I-I' cutting line in FIG. 4.
Figure 7:
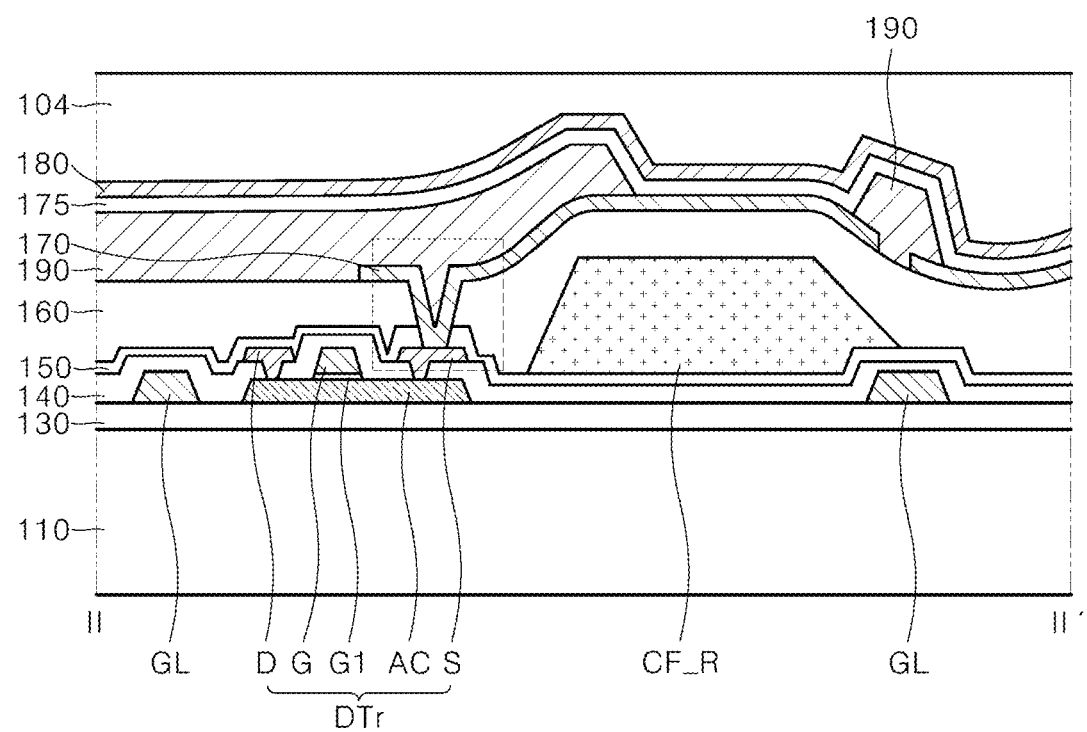
FIG. 7 is a cross-sectional view of an organic light emitting display device cut along a II-II' cutting line of FIG. 4.

FIG. 4 is a schematic plan view of a pixel P of an organic light emitting display device according to one embodiment of the present disclosure. FIG. 5 is a schematic plan view of a pixel P of an organic light emitting display device according to another embodiment of the present disclosure. FIG. 6 is a cross-sectional view of the organic light emitting display device cut along the I-I' cutting line in FIG. 4. FIG. 7 is a cross-sectional view of the organic light emitting display device cut along the II-II' cutting line of FIG. 4.

Referring to FIG. 4, FIG. 6 and FIG. 7, the organic light emitting display device according to one embodiment of the present disclosure includes a red R sub-pixel, a green G sub-pixel, a blue B sub-pixel and a white W sub-pixel arranged in a quad type of a 2×2 matrix form and on a substrate 110, and includes the red color filter CF_R disposed in the R sub-pixel, the green color filter CF_G disposed in the G sub-pixel, and the blue color filter CF_B disposed in the B sub-pixel area. In this embodiment, the R sub-pixel, the G sub-pixel, the B sub-pixel, and the W sub-pixel are arranged in this order along the clock direction. In other words, in this embodiment, the R sub-pixel is disposed at an upper left portion of the pixel P, the G sub-pixel is disposed at an upper right portion of the pixel P, the B sub-pixel is disposed at a lower right portion of the pixel P, and the W sub-pixel is disposed at a lower left portion of the pixel P.

On the substrate 110, a buffer layer 130, a driving thin-film transistor DTr, an interlayer insulating film 140, a passivation layer 150, a planarization layer 160, a bank 190, color filters CF_R, CF_B, and CF_G, an anode 170, an organic light emitting layer 175 and a cathode 180 may be vertically and sequentially stacked.

According to an example, the buffer layer 130 may be formed by stacking a plurality of inorganic layers. For example, the buffer layer 130 may be formed of a multilayer in which at least two inorganic layers among a silicon oxide layer $SiO_x$, a silicon nitride layer $SiN_x$, and a silicon oxynitride layer SiON are stacked vertically. This buffer layer 130 may be formed on an entire top face of the substrate 110 to prevent moisture from penetrating into the organic light emitting element through the substrate 110.

The driving thin-film transistor DTr may be disposed on a top face of the buffer layer 130. According to an example, the driving thin-film transistor DTr may include an active layer AC, a gate electrode G, a drain electrode D, and a source electrode S. The active layer AC may be disposed on the buffer layer 130 so as to overlap with the light blocking layer LS. The active layer AC may be in direct contact with source electrode S and the drain electrode D. The active layer AC may face away from the gate electrode G while the gate insulating film GI may be interposed therebetween. The gate insulating film GI may only be disposed between the gate electrode G and the active layer AC. Alternatively, the gate insulating film GI may be disposed on the active layer AC and the buffer layer 130. The gate electrode G may be disposed on the gate insulating film GI. The gate electrode G may overlap with the active layer AC while the gate insulating film GI is interposed therebetween. Further, gate lines GL may be disposed on the buffer layer 130. For example, the gate lines GL may be made of the same material as the gate electrode G.

The interlayer insulating film 140 may be disposed on the gate electrode G, the active layer AC, and the buffer layer 130. The interlayer insulating film 140 may protect the driving thin-film transistor DTr and may insulate the drain electrode D and the source electrode S from the gate electrode G. The interlayer insulating film 140 may be partially removed to allow contact between the active layer AC and the source electrode S or the drain electrode D. For example, the interlayer insulating film 140 may include contact holes through which the source electrode S and the drain electrode D pass.

The drain electrode D and the source electrode S may be spaced apart from each other and disposed on the interlayer insulating film 140. The drain electrode D may contact one side of the active layer AC via one contact hole provided in the interlayer insulating film 140, while the source electrode S may contact the opposite side of the active layer AC via the opposite contact hole provided in the interlayer insulating film 140. Further, data lines DL and power lines PL may be disposed on the interlayer insulating film 140. For example, the data lines DL and the power lines PL may be made of the same material as the drain electrode D and the source electrode S.

FIG. 7 shows that the driving thin-film transistor DTr has a top gate structure. However, the present disclosure is not limited thereto. The driving thin-film transistor DTr may have a bottom gate structure, or a double gate structure.

The passivation layer 150 may be disposed on the interlayer insulating film 140 and the driving thin-film transistor DTr. The passivation layer 150 may protect the driving thin-film transistor DTr. The passivation layer 150 may be made of an inorganic insulating material such as silicon oxide and silicon nitride, or an organic insulating material such as photoacrylic or benzocyclobutene.

Red, green, blue color filters CF_R, CF_G, and CF_B corresponding to R, G, B sub-pixels may be provided on the passivation layer 150 covering the data line DL and the power line PL. The red color filter CF_R is located in the R sub-pixel. The green color filter CF_G is located in the G sub-pixel. The blue color filter CF_B is located in the B sub-pixel.

The planarization layer 160 covering the red, green, blue color filters CF_R, CF_G, and CF_B may be formed on the passivation layer 150. The planarization layer 160 may have a concave portion CV of a lens shape in the W sub-pixel, wherein the concave portion CV has a width greater than a width of the W sub-pixel. Thus, the organic light emitting display device 100 includes the planarization layer 160 having the concave portion CV of the lens shape in the W sub-pixel, such that the light extraction efficiency of the W sub-pixel may be improved. Further, as the light extraction efficiency of the W sub-pixel improves, the power consumption of the organic light emitting display device 100 may decrease.

The concave portion CV of the planarization layer 160 may have an aspherical lens shape. The lens shape of the concave portion CV of the planarization layer 160 may be determined based on a lower structure of the W sub-pixel and a shape of each of the color filters surrounding the W sub-pixel.

In order for the concave portion CV of the planarization layer 160 to have the lens shape, each of a side face of the red color filter CF_R adjacent to the W sub-pixel area and a side face of the blue color filter CF_B adjacent thereto may include a concave area.

In an embodiment shown in FIG. 4, a curvature of the concave area of the side face of the red color filter CF_R adjacent to the W sub-pixel area and the curvature of the concave area of the side face of the blue color filter CF_B adjacent thereto may be the same as each other. In an embodiment shown in FIG. 4, a maximum spacing d1 between adjacent side faces of the blue color filters CF_B adjacent to the W sub-pixel area in a first direction (left and right direction in FIG. 4) and a maximum spacing d2 between adjacent side faces of the red color filters CF_R adjacent to the W sub-pixel area in a second direction (up and down direction in FIG. 4) perpendicular to the first direction may be the same as each other. That is, when the concave portion CV of the lens shape formed on the planarization layer 160 in the W sub-pixel area has a first width in the first direction, and has a second width in the second direction perpendicular to the first direction, the first width and the second width may be the same as each other.

In an embodiment shown in FIG. 5, a curvature of the concave area of the side face of the red color filter CF_R adjacent to the W sub-pixel area and a curvature of the concave area of the side face of the blue color filter CF_B adjacent thereto may be different from each other. For example, the curvature of the concave area of the side face of the red color filter CF_R adjacent to the W sub-pixel area may be greater than the curvature of the concave area of the side face of the blue color filter CF_B adjacent to the W sub-pixel area. In an embodiment shown in FIG. 5, a maximum spacing d1' between adjacent side faces of the blue color filters CF_B adjacent to the W sub-pixel area in the first direction (left and right direction in FIG. 5) and a maximum spacing d2 between adjacent side faces of the red color filters CF_R adjacent to the W sub-pixel area in the second direction (up and down direction in FIG. 5) perpendicular to the first direction may be different from each other. The maximum spacing d1' between adjacent side faces of the blue color filters CF_B adjacent to the W sub-pixel area in the first direction (left and right direction in FIG. 5) may be smaller than the maximum spacing d2 between adjacent side faces of the red color filters CF_R adjacent to the W sub-pixel area in the second direction (up and down direction in FIG. 5) perpendicular to the first direction may be different from each other. That is, when the concave portion CV of the lens shape formed on the planarization layer 160 in the W sub-pixel area has a first width in the first direction, and a second width in the second direction perpendicular to the first direction, the first width may be smaller than the second width.

In one embodiment of the present disclosure, increasing a molecular weight of a polymer in a composition constituting the planarization layer 160, and introducing a polar functional group that may enhance interaction between molecules in the polymer may allow fluidity of the composition to be reduced. Thus, without performing exposure and etching processes, the planarization layer 160 may be formed to have a lens-shaped concave portion in the W sub-pixel surrounded by the red, green, and blue color filters CF_R, CF_G, and CF_B.

A composition for forming the planarization layer 160 includes a polymer, a monomer, a photo-initiator, additives, a surfactant, and a solvent for dispersing the polymer, the monomer, the photo-initiator, the additives, and the surfactant.

A composition for forming the planarization layer 160 may be composed of 60% to 80% of the solvent, and a remaining percentage of the remaining components, that is, the polymer, the monomer, the photo-initiator, the additives, and the surfactant. A total 100% of the remaining components may be composed of 60 to 70 parts by weight of the polymer, 20 to 30 parts by weight of the monomer, 1 to 10 parts by weight of the photo-initiator, 0.1 to 10 parts by weight of the additive, and 0.1 to 1 part by weight of the surfactant.

The photo-initiator may affect a curing rate and a film strength of the planarization layer. Specific examples of the photo-initiator may include at least one selected from acetophenone based compounds such as 2,2'-diethoxyacetophenone, 2,2'-dibutoxyacetophenone, 2-hydroxy-2-methylpropriophenone, p-t-tyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one; benzophenone based compounds such as benzophenone, benzoylbenzoic acid, methyl benzoylbenzoate, 4-phenylbenzophenone, hydroxybenzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone; thioxanthone based compounds such as thioxanthone, 2-methyl thioxanthone, isopropyl thioxanthone, 2,4-diethyl thioxanthone, 2,4-diisopropyl thioxanthone, and 2-chloro thioxanthone; benzoin based compounds such as benzoin, benzoin methyl ether, benzoin ethyl ether, benzoin isopropyl ether, benzoin isobutyl ether, and benzyl dimethyl ketal; and triazine-based compounds such as 2,4,6-trichloro s-triazine, 2-phenyl 4,6-bis(trichloromethyl)-s-tria, 2-(3',4'-dimethoxy styryl)-4,6-bis(trichloromethyl)-s-triazine, 2-(4'-methoxy naphthyl)-4,6-bis(trichloromethyl)-s-triazine, 2-(p-methoxy phenyl)-4,6-bis (trichloromethyl)-s-triazine, 2-(p-tril)-4,6-bis(trichloromethyl)-s-triazine, 2-phenyl 4,6-bis (trichloromethyl)-s-triazine, bis(trichloromethyl)-6-styryl-s-triazine, 2-(naphtho 1-yl)-4,6-bis (trichloromethyl)-s-triazine, 2-(4-methoxy naphtho 1-yl)-4,6-bis(trichloromethyl)-s-triazine, 2-4-trichloromethyl(piperonyl)-6-triazine, 2-4- trichloromethyl(4'-methoxystyryl)-6-triazine. The additive may include an adhesion promotor or a radical trapper, or a UV absorber.

To form the planarization layer 160, the composition may be applied on the substrate 110 on which the red, green, blue color filters CF_R, CF_G, and CF_B are formed to surround the W sub-pixel. Thereafter, the solvent of the composition is removed away via volatilization in a vacuum drying process or a pre-baking process. At this time, suppressing the fluidity of the photosensitive compound may allow the concave portion to be formed in the W sub-pixel which is surrounded by the red, green, blue color filters CF_R, CF_G, and CF_B, and in which no color filter is disposed.

The polymer in the composition for forming the planarization layer 160 may include a bulky functional group, for example, a maleimide group, a phenyl group, a cycloalkane group, and the like. The monomer in the composition for forming the planarization layer 160 may include a hydroxy (OH) group. For example, the monomer may include methyl methacrylate, 2-hydroxyethyl Acrylate, 1,6-hexanediol diacrylate, trimethylolpropane triacrylate, dipentaerythritol hexaacrylate, and the like.

Therefore, the planarization layer 160 including the concave portion CV formed in the W sub-pixel may include one or more of a maleimide group, a phenyl group, a cycloalkane group, and a hydroxy (OH) group.

The planarization layer 160 includes a through-hole 160h. The anode 170 is disposed on the planarization layer 160 and is electrically connected to the source electrode S of the driving thin-film transistor DTr via the through-hole 160h. The anode 170 may contact the source electrode S via a through-hole of the passivation layer 150 which is connected to the through-hole 160h of the planarization layer 160. When a slope of a side wall of the through-hole 160h of the planarization layer 160 is too steep, in other words, a taper angle of the through-hole 160h is too large, for example, about 65 to 85 degrees, the anode 170 is not well deposited on the side wall of the through-hole 160h, such that a thickness of the anode 170 becomes smaller, which may lead to discontinuation of the anode. For this reason, it is necessary to ensure that the slope of the side wall of the through-hole 160h of the planarization layer 160 is not steep, in other words, the taper angle of the through-hole 160h is not too large.

In accordance with the present disclosure, because the fluidity of the composition for forming the planarization layer 160 is reduced, the planarization layer 160 formed in regions which includes an area where the driving thin-film transistor DTr is formed and in which the color filters are not formed may have smaller thickness than a thickness of a conventional planarization layer formed of a composition with greater fluidity. This is because as the fluidity of the composition is lower, a lower amount of the composition may be collected into a lower area where the color filters are not formed during a process of removing the solvent such as vacuum drying process. As such, as the applied thickness is smaller, the slope of the side wall of the through-hole 160h is gentle when forming the through-hole 160h in the planarization layer 160 through the exposure process.

Figure 8:
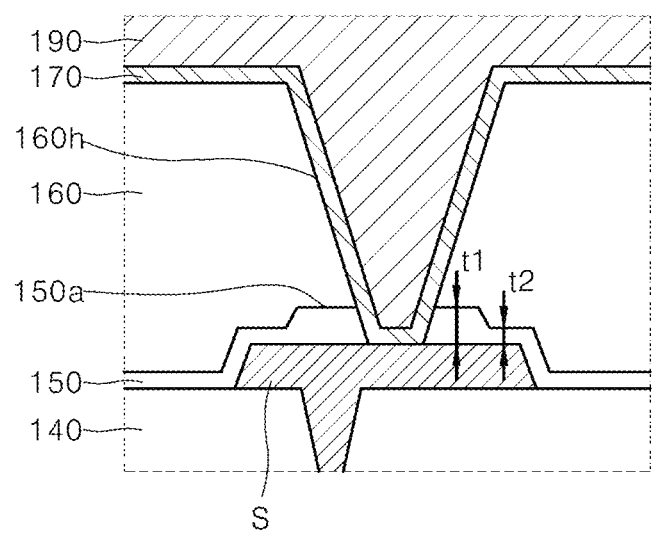
FIG. 8 is an enlarged view of an area A in FIG. 7.

FIG. 8 is an enlarged view of an area A in FIG. 7.

Referring to FIG. 8, the anode 170 of the organic light emitting element passes through the planarization layer 160 and the passivation layer 150 and is connected to the source electrode S of the driving thin-film transistor DTr. Since the slope of the side wall of the through-hole 160h of planarization layer 160 is gentle, for example, is smaller than 60 degrees, the anode 170 may be formed in a uniform thickness on the side wall of the through-hole 160h of the planarization layer 160. Thus, the discontinuation of the anode 170 may not occur. The passivation layer 150 under the through-hole 160h of the planarization layer 160 may have areas having different thicknesses on a top face of the source electrode S. The passivation layer 150 may have a first area (hereinafter, referred to as an adjacent region) 150a adjacent to the through-hole 160h of the planarization layer 160 and having a thickness t1, and a second area not adjacent thereto and having a second thickness t2 smaller than the thickness t1. The thickness t1 of the adjacent area or the first area 150a of the passivation layer 150 may be in a range of 0.35 to 1.0 μm, and may be, for example, 0.7 μm, while the thickness t2 of the remaining area or the second area of the passivation layer 150 may be in a range of 0.1 to 0.35 μm, and may be, for example, 0.3 μm. In this way, when the thickness of the adjacent area 150a of the passivation layer 150 adjacent to the through-hole 160h of the planarization layer 160 is larger, a length of a diffuse reflection path due to the source electrode S as the underlying metal layer is enlarged during a exposure process to form the through-hole 160h of the planarization layer 160, so that the slope of the side wall of the through-hole 160h of the planarization layer 160 may be gentle.

Referring back to FIGS. 6 and 7, the bank 190 is provided along and on an edge of the anode 270 to define the light emitting areas of the sub-pixels. The bank 190 may fill the through-hole 160h of the planarization layer 160. The organic light emitting layer 175 and the cathode 180 are sequentially and vertically stacked on the bank 190 and the anode 170. In this connection, the anode 170, the organic light emitting layer 175 and the cathode 180 constitute the organic light emitting element. The organic light emitting layer 175 may emit white light.

Figure 9:
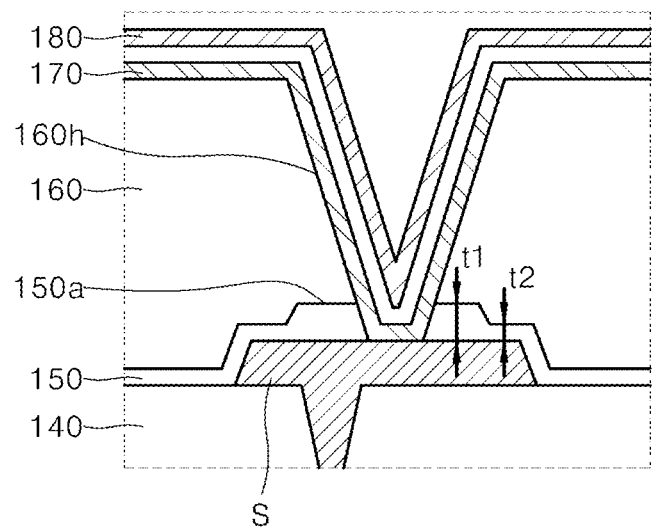
FIG. 9 shows a portion of an organic light emitting display device according to another embodiment of the present disclosure, and is a cross-sectional view of an area corresponding to FIG. 8.

FIG. 9 shows a portion of an organic light emitting display device according to another embodiment of the present disclosure, and is a cross-sectional view of an area corresponding to FIG. 8.

Referring to FIG. 9, the organic light emitting display device according to one embodiment of the present disclosure may not include the bank (190 in FIG. 8). In this case, the anode 170, the organic light emitting layer 175 and the cathode 180 may be sequentially stacked within the through-hole 160h of the planarization layer 160. When the slope of the side wall of through-hole 160h of the planarization layer 160 is steep, the deposition of the anode 170, the organic light emitting layer 175 and the cathode 180 is not smoothly carried out, so that the thicknesses of anode 170, the organic light emitting layer 175 and the cathode 180 may not be uniform. This may lead to dark spot defects. However, in one embodiment of the present disclosure, due to the planarization layer 160 with the reduced fluidity and the formation of the adjacent region 150a of the passivation layer 150 below an area where the through-hole of the planarization layer 160 is to be formed, the slope of the side wall of the through-hole 160h of the planarization layer 160 may be gentle. Thus, no dark spot defects occur.

Figure 10:
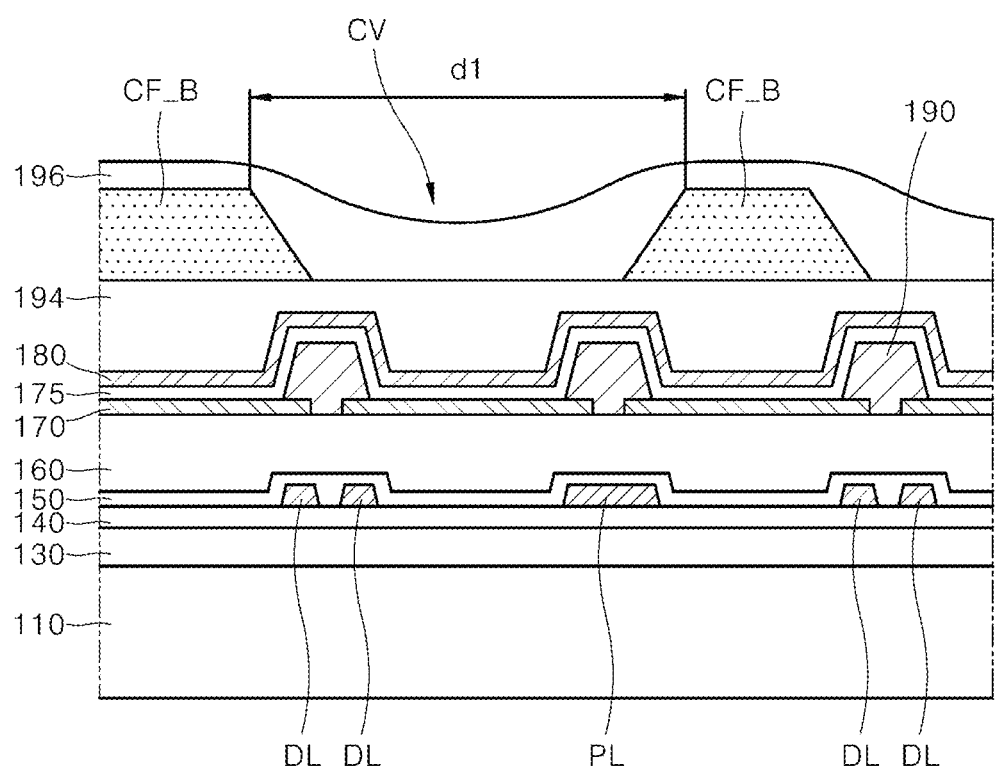
FIG. 10 shows a portion of an organic light emitting display device according to another embodiment of the present disclosure, and is a cross-sectional view of an area corresponding to FIG. 6.

FIG. 10 shows a portion of an organic light emitting display device according to another embodiment of the present disclosure, and is a cross-sectional view of an area corresponding to FIG. 6. The organic light emitting display device shown in FIG. 6 is of a bottom emission type, while the organic light emitting display device shown in FIG. 10 is of a top emission type. In FIG. 10, only vertical positions of the color filters and the concave portion are different from those in FIG. 6, while the rest configurations thereof are the same as each other. Therefore, the contents as described above with reference to FIG. 1 to FIG. 6 may be applied identically or similarly to FIG. 10.

Referring to FIG. 10, in the organic light emitting display device according to the present embodiment, a first planarization layer 160 is formed while no color filters are formed on the passivation layer 150. Organic light emitting elements respectively disposed in R, G, B, W sub-pixels may be formed on the first planarization layer 160. Color filters CF_R, CF_G, and CF_B are formed on an encapsulation layer 194 that covers the organic light emitting elements. Then, a second planarization layer 196 may be formed thereon. In this embodiment, the second planarization layer 196 formed on the encapsulation layer 194 may have a concave portion CV in the W sub-pixel. Accordingly, an organic light emitting display device having improved light extraction efficiency of the W sub-pixel may be provided.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. An organic light emitting display device comprising:
a substrate having a first sub-pixel, a second sub-pixel, a third sub-pixel, and a fourth sub-pixel arranged in a quad type of a 2×2 matrix form;
a first color filter disposed in the first sub-pixel;
a second color filter disposed in the second sub-pixel;
a third color filter disposed in the third sub-pixel; and
a planarization layer covering the first, second, and third color filters,
wherein the planarization layer has a concave portion of a lens shape in the fourth sub-pixel, and
wherein the concave portion has a width greater than a width of the fourth sub-pixel.

2. The device of claim 1, wherein the concave portion has an aspherical lens shape.

3. The device of claim 1, wherein the concave portion of the lens shape has a first width in a first direction, and has the second width in a second direction perpendicular to the first direction, wherein the first width and the second width are equal to each other.

4. The device of claim 1, wherein the concave portion of the lens shape has a first width in a first direction, and has the second width in a second direction perpendicular to the first direction, wherein the first width is smaller than the second width.

5. The device of claim 1, wherein each of a side face of the first color filter adjacent to the fourth sub-pixel and a side face of the third color filter adjacent to the fourth sub-pixel has a concave area.

6. The device of claim 5, wherein a curvature of the concave area of the side face of the first color filter adjacent to the fourth sub-pixel and a curvature of the concave area of the side face of the third color filter adjacent to the fourth sub-pixel are equal to each other.

7. The device of claim 5, wherein the curvature of the concave area of the side face of the first color filter adjacent to the fourth sub-pixel is greater than the curvature of the concave area of the side face of the third color filter adjacent to the fourth sub-pixel.

8. The device of claim 1, further comprising dummy sub-pixels respectively disposed along and in at least two edge areas of four edge areas of a display area of the substrate.

9. The device of claim 1, further comprising an organic light emitting element disposed on the concave portion and emitting white light.

10. The device of claim 1, further comprising:
organic light emitting elements respectively disposed in the first to fourth sub-pixels; and
an encapsulation layer covering the organic light emitting elements,
wherein the first, second, and third color filters and the planarization layer are disposed on the encapsulation layer.

11. The device of claim 1, wherein the planarization layer contains at least one functional group selected from a group consisting of a maleimide group, a phenyl group, a cycloalkane group, and a hydroxy group.

12. The device of claim 1, further comprising
a thin-film transistor formed on the substrate;
a passivation layer covering the thin-film transistor and disposed below the planarization layer; and
an organic light emitting element disposed on the planarization layer.

13. The device of claim 12, wherein an anode of the organic light emitting element extends through the planarization layer and the passivation layer and is connected to a source electrode of the thin-film transistor,
wherein the passivation layer has areas having different thickness on the source electrode.

14. The device of claim 13, wherein the passivation layer includes a first area adjacent to a through-hole of the planarization layer, and a second area other than the first area, wherein a thickness of the first area is larger than a thickness of the second area.

15. An organic light emitting display device comprising:
a substrate having a first sub-pixel, a second sub-pixel, a third sub-pixel, and a fourth sub-pixel sequentially arranged in a clockwise direction in a form of a 2×2 matrix;
a first color filter disposed in the first sub-pixel;
a second color filter disposed in the second sub-pixel;
a third color filter disposed in the third sub-pixel; and
a planarization layer covering the first, second, and third color filters,
wherein the planarization layer has a concave portion of a lens shape in the fourth sub-pixel,
wherein the concave portion has a width greater than a width of the fourth sub-pixel,
wherein each of a side face of the first color filter adjacent to the fourth sub-pixel and a side face of the third color filter adjacent to the fourth sub-pixel has a concave area.

16. The device of claim 15, wherein a curvature of the concave area of the side face of the first color filter adjacent to the fourth sub-pixel and a curvature of the concave area of the side face of the third color filter adjacent to the fourth sub-pixel are equal to each other.

17. The device of claim 15, wherein the curvature of the concave area of the side face of the first color filter adjacent to the fourth sub-pixel is greater than the curvature of the concave area of the side face of the third color filter adjacent to the fourth sub-pixel.

18. The device of claim 15, wherein a maximum spacing between adjacent side faces of two first color filters adjacent to the fourth sub-pixel is equal to a maximum spacing between adjacent side faces of two third color filters adjacent to the fourth sub-pixel.

19. The device of claim 15, wherein a maximum spacing between adjacent side faces of two first color filters adjacent to the fourth sub-pixel is different from a maximum spacing between adjacent side faces of two third color filters adjacent to the fourth sub-pixel.

20. The device of claim 15, wherein the planarization layer contains at least one functional group selected from a group consisting of a maleimide group, a phenyl group, a cycloalkane group, and a hydroxy group.

* * * * *